United States Patent [19]

Kawakami

[11] Patent Number: 4,632,728
[45] Date of Patent: Dec. 30, 1986

[54] METHOD OF MANUFACTURING A GLASS PASSIVATION TYPE SEMICONDUCTOR DEVICE

[75] Inventor: Minoru Kawakami, Fukuoka City, Japan

[73] Assignee: Mitsubishi Denki Kabushiki Kaisha, Tokyo, Japan

[21] Appl. No.: 788,645

[22] Filed: Oct. 17, 1985

[30] Foreign Application Priority Data

Nov. 16, 1984 [JP] Japan ................. 59-242765

[51] Int. Cl.$^4$ .............. H01L 21/306; B44C 1/22; C03C 15/00; C03C 25/06
[52] U.S. Cl. .............. 156/659.1; 29/576 W; 29/580; 156/657; 156/662; 156/663; 156/648; 357/50; 427/93; 427/272
[58] Field of Search .............. 29/576 W, 580; 357/50; 427/93, 272, 279; 156/89, 655, 657, 659.1, 662, 663, 648

[56] References Cited

U.S. PATENT DOCUMENTS 3,847,687 11/1974 Davidsohn .................. 148/187
4,104,086 8/1978 Bondur et al. .................. 148/1.5

Primary Examiner—William A. Powell
Attorney, Agent, or Firm—Leydig, Voit & Mayer

[57] ABSTRACT

In a method of manufacturing a glass passivation type semiconductor device wherein a silicon semiconductor substrate of a first conductivity type is formed with a p-n junction by diffusing an impurity of a second conductivity type thereinto, recesses which reach the p-n junction are provided to expose the p-n junction in the recesses, and the exposed parts of the p-n junction are covered with a low-melting glass; a method of manufacturing a glass passivation type semiconductor device according to this invention consists in that, using a printing mask, a glass is deposited on a whole surface of a wafer except for an outer periphery of the wafer or predetermined parts thereof necessary for alingment at a subsequent step, with the glass films at the bottoms of said recesses and the p-n junction parts being rendered at least 10 μm thick and glass films at the other parts being rendered 4-10 μm thick, and that unnecessary portions of said glass films are thereafter removed by etching, using a photoresist as a mask.

1 Claim, 7 Drawing Figures

METHOD OF MANUFACTURING A GLASS PASSIVATION TYPE SEMICONDUCTOR DEVICE

BACKGROUND OF THE INVENTION

The present invention relates to improvements in a method of manufacturing a glass passivation type semiconductor device.

In recent years, in semiconductor elements for medium and low power levels, the glass passivation type in which recesses reaching a p-n junction are provided in a silicon wafer to expose the p-n junction in the recesses and in which the exposed parts of the p-n junction are covered with a low-melting glass has become the mainstream owing to ease in the mass processing of surface protection.

A prior-art device of this type will be described with reference to FIGS. 5 to 7. In the figures, numeral 1 designates an n-type silicon substrate, which is formed by well-known diffusion techniques with a p-type diffused layer 2 and an n+ diffused layer 3 for attaining an ohmic contact. Numeral 4 designates exposed portions where silicon parts are exposed, numeral 5 covered portions which are covered with an SiO$_2$ film, a photoresist film or the like capable of withstanding a silicon etchant of a nitric acid—fluoric acid system, numeral 6 a p-n junction, numeral 7 a recess the p-n junction 6 is exposed, numeral 8 a low-melting passivation glass which is buried in the recess 7 and which is vitrified by treatment, and numerals 9 and 10 electrode portions which are respectively formed by a process such as vacuum deposition or plating.

In the device constructed as described above, the p-type diffused layer 2 and the n diffused layer 3 are first formed in the n-type silicon substrate 1 by well-known diffusion techniques, whereupon the exposed portions 4, where the silicon parts are exposed, and the covered portions 5, which are covered with the SiO$_2$ film, the photoresist film or the like, are formed by photoengraving. Subsequently, the exposed portions 4 are etched to expose the p-n junction 6 in the recesses 7. Thereafter, while care is taken of the degree of cleanness of the exposed parts of the p-n junction 6, the low-melting passivation glass 8 is buried in the recesses 7 and is vitrified by a heat treatment. Thereafter, the electrode portions 9 and 10 are formed by vacuum evaporation, plating, etc. as shown in FIG. 6, and positions indicated by dot-and-dash lines in the figure are cut to obtain a plurality of diodes.

In case of burying the passivation glass 8 in the recesses 7, a printing method and a doctor blade method are more effective than electrodeposition and sedimentation in consideration of mass-producibility, and hence, any of the methods is employed. The passivation glass 8 is subsequently heat-treated under predetermined conditions, whereby it is secured in the recesses 7. Next, a method of depositing the glass will be described in detail. The electrodeposition and the sedimentation are difficult of controlling the thickness of a glass film and cause very great deviations in the film thickness, and they are also inferior in the processing ability. On the other hand, the printing method and the doctor blade method are favorable in the mass producibility, but they sometimes deposit the glass imperfectly or deposit the glass to unnecessary parts. This will be explained with reference to FIG. 7. 11 indicates undeposited portions where the passivation glass 8 is not deposited, and 12 unnecessary portions where the passivation glass 8 is deposited. That is, even with the printing method and the doctor blade method, the undeposited portions 11 and the unnecessary portions 12 arise.

As stated above, with the prior-art method, the passivation glass is deposited to only the recesses 7. In order to prevent the passivation glass from depositing around the recesses 7, an emulsion is applied between a mask and the silicon substrate. However, a glass paste with the glass and a solvent mixed can ooze out to the side of the emulsion, resulting in the problem that the glass is deposited on unnecessary portions.

SUMMARY OF THE INVENTION

The present invention has been made in order to eliminate the disadvantage mentioned above, and has for its object to provide a method of manufacturing a glass passivation type semiconductor device which can solve the problem of the printing method and the doctor blade method and which can reliably deposite the glass on necessary portions while preventing the deposition of the glass on the unnecessary portions other than the recesses.

According to this invention, the glass is deposited on the whole surface of the wafer except for the outer periphery of the wafer or predetermined parts thereof by the use of the printing mask, and the uncecessary portions of the glass films are thereafter removed by etching with the photoresist as the mask, so that the glass film is not left deposited on unnecessary portions. In addition, the thickness of the glass films are rendered at least 10 μm at the bottoms of the recesses and the p-n junction parts, and the thicknesses of the glass films at the other parts are rendered 4–10 μm, so that the glass can be reliably deposited to the p-n junction parts, and that the bulges of the glass to appear in the peripheries of the recesses are prevented.

BRIEF DESCRIPTION OF THE DRAWINGS

In the drawings, the same symbols indicate identical or corresponding portions.

DESCRIPTION OF PREFERRED EMBODIMENT

Now, one embodiment of this invention will be described in conjunction with FIGS. 1 to 4. In the figures, numerals 1–7 are similar to the symbols of the prior art described above, and the description will not be repeated herebelow.

Figure 1:
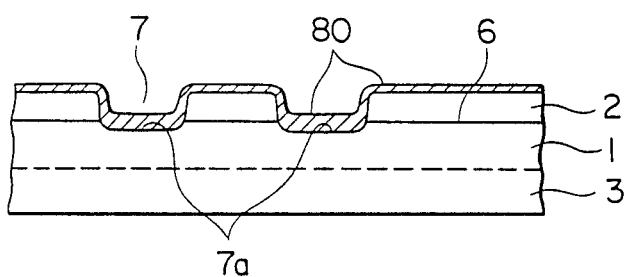
FIG. 1 is a sectional view showing the first step of one embodiment of this invention.
Figure 2:
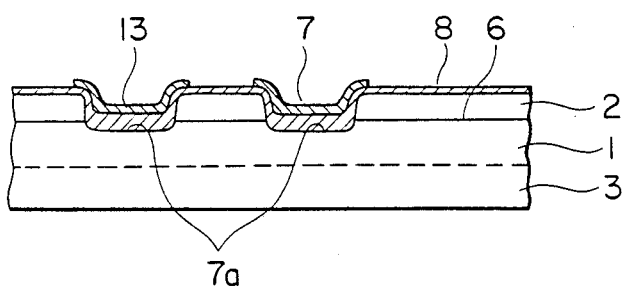
FIG. 2 is a sectional view showing the second step thereof.
Figure 3:
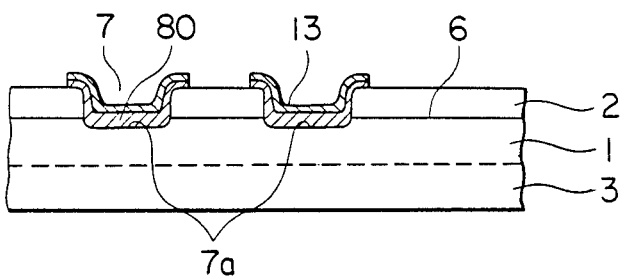
FIG. 3 is a sectional view showing the third step thereof.
Figure 4:
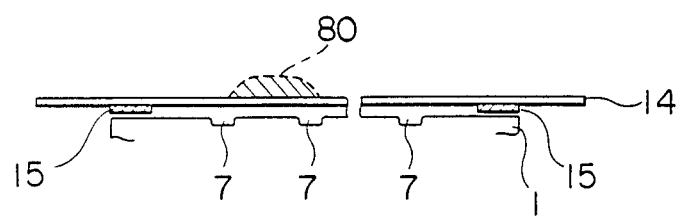
FIG. 4 is a partial sectional view of this invention.
Figure 5:
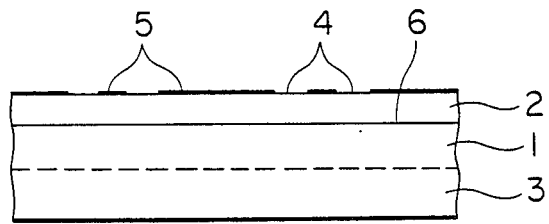
FIG. 5 is a sectional view showing the first step of a prior-art method.
Figure 6:
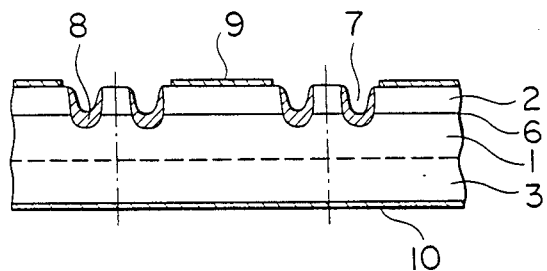
FIG. 6 is a sectional view showing the second step thereof.
Figure 7:
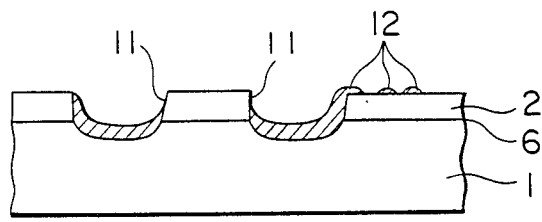
FIG. 7 is a sectional view of the essential portions of the prior art.

Referring to the FIGS., numeral 80 designated a passivation glass, which is deposited by the printing method on the whole surface of the silicon substrate 1 except for the outer periphery of the silicon substrate or alignment portions thereof necessary for the subsequent step. The film 80 at the bottoms 7a of the recesses 7 formed in the p-n junctions 6 is rendered at least 10 μm thick and the film at the other parts rendered 4 μm–10 μm. Numeral 13 indicates a photoresist which serves as a mask when removing the unnecessary parts of the passivation glass 80 by etching, numeral 14 a printing mask which serves for coating the whole surface with the passivation glass 80 except for the outer peripheral surface of the silicon substrate 1 or the alignment portions thereof necessary for the subsequent step, and numeral 15 an emulsion with which portions of the lower surface of the printing mask 14 is coated and which is applied to portions contacting the substrate 1 which are not to have the passivation glass 80 deposited thereon. In the embodiment of the above construction, the printing mask 14 confronts the silicon substrate 1, and the mesh size of this printing mask 14 is selected to be at least 300 meshes. The side of the printing mask 14 closer to the silicon substrate 1 is coated with the emulsion 15, the thickness of which is rendered 10 μm or less. Besides, the grain diameter of the powder of the passivation glass 80 is selected at an average diameter of at most 3 μm. The powder of the passivation glass 80 is further mixed with a solvent into the state of a paste, which is placed on the printing mask 14. This passivation glass 80 is deposited through the meshes of the printing mask 14 to the area other than the portions coated with the emulsion 15. In this case, the film thickness of the passivation glass 80 is rendered at least 10 μm at the bottoms 7a of the recesses 7 formed in the p-n junction 6, and the film thickness at the other portions is rendered 4 μm–10 μm. Subsequently, the passivation glass 80 is coated with the photoresist 13, and the unnecessary portions of the photoresist are removed using the photoengraving technique as shown in FIG. 2. Further, the unnecessary portions of the passivation glass 80 are removed as shown in FIG. 3 by the use of an etchant containing fluoric acid and hydrochloric acid. More specifically, since the passivation glass 80 is deposited on the whole area around the recesses 7, the ooze of the paste of the passivation glass 80 into the emulsion 15 is eliminated, and since the passivation glass is kept as thin as 4–10 μm, it can be fully removed by using the photoresist 13 as the mask. In addition, the passivation glass 80 in the peripheries of the recesses 7 can have its bulges thinned to 4–5 μm, so that at the time of assemblage, the salient part of the passivation glass 80 is prevented from touching other portions which may cause a piece thereof to brake of.

While, in the above, the manufacture of diodes has been explained as an example, it is needless to say that the invention can also be utilized for other semiconductor devices of the glass passivation type.

As described above, in a method of manufacturing a glass passivation type semiconductor device wherein a silicon semiconductor substrate of a first conductivity type is formed with a p-n junction by diffusing an impurity of a second conductivity type thereinto, recesses which reach the p-n junction are provided to expose the p-n junction in the recesses, and the exposed parts of the p-n junction are covered with a low-melting glass, the present invention consists in that, using a printing mask, a glass is deposited on a whole surface of a wafer except for an outer periphery of the wafer or predetermined parts thereof necessary for alignment at a subsequent step, with the glass films at the bottoms of said recesses and the p-n junction parts being rendered at least 10 μm thick and glass films at the other parts being rendered 4–10 μm thick, and that unnecessary portions of said glass films are thereafter removed by etching, using a photoresist as a mask. Therefore, the glass can be sufficiently deposited in the recesses, and the unnecessary portions of the glass can be fully removed, to bring forth not only the effect that the quality of a product can be enhanced, but also the effect that the breaking of the glass at the time of assemblage can be prevented, thereby increasing the percentage of usable devices.

What is claimed is:

1. In a method of manufacturing a glass passivation type semiconductor device wherein a silicon semiconductor substrate of a first conductivity type is formed with a p-n junction by diffusing an impurity of a second conductivity type thereinto, recesses which reach the p-n junction are provided to expose the p-n junction in the recesses, and the exposed parts of the p-n junction are covered with a low-melting glass; a method of manufacturing a glass passivation type semiconductor device characterized in that, using a printing mask, a glass is deposited on a whole surface of a wafer except for an outer periphery of the wafer or predetermined parts thereof necessary for alignment at a subsequent step, with the glass films at the bottoms of said recesses and the p-n junction parts being rendered at least 10 μm thick, and that unnecessary portions of said glass films are thereafter removed by etching, using a photoresist as a mask.

* * * * *